United States Patent
Feldman et al.

(10) Patent No.: US 8,051,241 B2
(45) Date of Patent: Nov. 1, 2011

(54) WEAR LEVELING TECHNIQUE FOR STORAGE DEVICES

(75) Inventors: Timothy R. Feldman, Louisville, CO (US); Jonathan W. Haines, Boulder, CO (US)

(73) Assignee: Seagate Technology LLC, Cupertino, CA (US)

( * ) Notice: Subject to any disclaimer, the term of this patent is extended or adjusted under 35 U.S.C. 154(b) by 350 days.

(21) Appl. No.: 12/437,040

(22) Filed: May 7, 2009

(65) Prior Publication Data
US 2010/0287328 A1    Nov. 11, 2010

(51) Int. Cl.
*G06F 12/00* (2006.01)
(52) U.S. Cl. .................. 711/103; 365/185.03
(58) Field of Classification Search .............. 711/103; 365/185.03
See application file for complete search history.

(56) References Cited

U.S. PATENT DOCUMENTS

| | | | |
|---|---|---|---|
| 6,850,443 B2 | 2/2005 | Lofgren | |
| 7,649,794 B2 * | 1/2010 | Yeh | 365/218 |
| 2006/0149896 A1 * | 7/2006 | Chang et al. | 711/103 |
| 2006/0155917 A1 | 7/2006 | Di Sena et al. | |
| 2006/0161728 A1 * | 7/2006 | Bennett et al. | 711/103 |
| 2008/0235432 A1 | 9/2008 | Chen et al. | |
| 2008/0276035 A1 | 11/2008 | Hobson | |
| 2008/0276038 A1 | 11/2008 | Tanaka et al. | |
| 2008/0282024 A1 | 11/2008 | Biswas et al. | |
| 2008/0282025 A1 | 11/2008 | Biswas et al. | |
| 2008/0313505 A1 | 12/2008 | Lee et al. | |
| 2008/0320209 A1 | 12/2008 | Lee et al. | |
| 2008/0320214 A1 | 12/2008 | Ma et al. | |
| 2009/0013233 A1 | 1/2009 | Radke | |
| 2009/0031076 A1 | 1/2009 | In et al. | |

OTHER PUBLICATIONS

Frequently Asked Questions, Corsair, USB Flash Wear-Leveling and Life Span, Jun. 2007, pp. 1-2.
White Paper, Sandisk Flash Memory Cards, Wear Leveling, Oct. 2003, pp. 1-6.

* cited by examiner

*Primary Examiner* — Michael Tran
(74) *Attorney, Agent, or Firm* — Brian R. Morrison; Westman, Champlin & Kelly, P.A.

(57) ABSTRACT

A method for managing wear levels in a storage device having a plurality of data blocks, the method comprising moving data to data blocks having higher erasure counts based on a constraint on static wear levelness that tightens over at least a portion of the lives of the plurality of data blocks.

20 Claims, 3 Drawing Sheets

WEAR LEVELING TECHNIQUE FOR STORAGE DEVICES

BACKGROUND

The present disclosure relates to data storage devices. In particular, the present disclosure relates to wear leveling techniques for extending the usable lives of storage devices, such as flash-based storage devices.

Data storage devices based on flash-based technologies are becoming increasingly popular for the storage of data. This is primarily due to their robust architecture, low power consumption, and compact designs. A common use of flash-based storage devices is in combination with computer interfaces, such as universal serial bus (USB) interfaces, to provide fast-access flash drives that can read and write data in a manner that is convenient for users. Such drives typically have storage capacities up to about 64 gigabytes, which is ideal for storing and transferring data between different computer systems. Additionally, many industries are focusing on larger, more permanent flash-based storage devices to replace or supplement hard disks in a variety of computer systems. These solid-state drives desirably have large storage capacities and may function as the primary drives of the computer systems for retaining operating systems, applications, documents, and other data files.

Flash-based storage devices include large numbers of data blocks for writing and reading data. Data may also be rewritten by erasing the previous version of the data and writing the new version to the same or different data blocks. However, erasure of data from a given data block typically requires erasure of the entire data block, regardless of whether all of the data within the data block needs to be erased. Furthermore, the data blocks in a flash-based storage device have limited numbers of erasure counts before failing, which limits the overall life of the storage device. Accordingly, the life of a flash-based storage device is typically limited to the available erasure counts of the data blocks.

Common techniques for increasing the usable lives of storage devices involve wear leveling techniques, where the data block erasures are distributed in a uniform manner. This allows the erasure counts of the data blocks to rise in a substantially even amount, thereby increasing the overall number of available erasures. However, larger storage devices, such as solid state drives, may include static data that is not commonly erased or rewritten (e.g., operating systems and computer applications). Current wear leveling techniques that attempt to maintain uniform or near uniform wear levelness in these storage devices actually induce additional data block erasures into the given devices for the sake of maintaining the uniform wear levelness. Thus, there is an ongoing need for wear leveling techniques that address such concerns and further increase the useful lives of storage devices, such as flash-based storage devices.

SUMMARY

An aspect of the present disclosure includes a method for managing wear levels in a storage device having a plurality of data blocks. The method includes copying data from a data block having a first erasure count (e.g., a low erasure count) to a data block having a higher erasure count, erasing the data from the data block having the minimum erasure count after copying the data, and allocating the erased data block for a subsequent writing operation. The method also includes repeating the copying, erasing, and allocating steps based on a constraint on static wear levelness that tightens over the lives of the plurality of data blocks.

Another aspect of the present disclosure includes a method for managing wear levels in a storage device having a plurality of physical data blocks, where the method includes determining an erasure count for each of the plurality of data blocks. The method also includes determining a parameter based at least in part on a maximum erasure count of the determined erasure counts, and determining a constraint threshold that defines a constraint on static wear levelness that varies over the lives of the plurality of data blocks. The method further includes moving data from a first data block having a first erasure count (e.g., a low erasure count) to a second data block having a higher erasure count higher in a manner that maintains the parameter bounded by the constraint threshold.

Another aspect of the present disclosure includes a method for managing wear levels in a storage drive having a plurality of physical blocks, where the method includes determining a parameter based at least in part on a maximum erasure count of the plurality of data blocks, and determining a constraint threshold based at least in part on a minimum erasure count of the plurality of data blocks. The method also includes copying data from a first data block to a second data block having a higher erasure count in a manner that maintains the parameter bounded by the constraint threshold.

DEFINITIONS

Unless otherwise specified, the following terms as used herein have the following meanings:

The term "static data" refers to data that is typically not rewritten or deleted on a frequent basis, and may remain unchanged for months or even years. Examples of static data may include operating system data, computer application data, and the like.

The term "dynamic data" refers to data that is frequently rewritten or deleted, such as on a weekly, daily or hourly basis. Examples of dynamic data may include file allocation table data, page swap file data, registry and journal data, data for document files (e.g., word processing files, emails, and digital photographs) and the like.

The term "erasure count" of a data block refers to a number of data erasures that have been performed on the data block.

The term "maximum erasure count" refers to a highest value of current erasure counts among all data blocks of a storage device.

The term "minimum erasure count" refers to a lowest value of current erasure counts among all data blocks of a storage device.

The term "end-of-life (EOL) erasure count" refers to an average number of predicted or predetermined erasure counts that data blocks of a storage device are capable of achieving before failure due to excessive erasures (e.g., 100,000 erasure counts).

DETAILED DESCRIPTION

The present disclosure is directed to a wear leveling of static data technique that increases the total number of useful data block erasures that a storage device is capable of achieving by decreasing the number of block erasures due to wear leveling of static data. The technique initially provides a loose constraint on the wear levelness of static data during the early life of the storage device. This loose constraint allows a large difference between maximum and minimum erasure counts to be attained before the wear leveling of static data is performed. However, as the storage device ages, the constraint tightens, thereby reducing the difference between maximum and minimum erasure counts that may be attained before additional wear leveling of static data is performed. This ensures that the EOL erasure count of all data blocks are used and the useful life of the storage device is increased, and more desirably, maximized.

As discussed above, during the early life of a storage device, movement and erasure of static data, merely for purposes of maintaining a uniform wear levelness, may actually induce additional data block erasures. Early wear leveling of static data in many common workloads is unnecessary as data changes characteristic from being static during early portions of the life of the drive to being dynamic data at later but still not near end-of-life portions of the life of the drive. The wear leveling technique of the present disclosure, however, reduces or restricts the unnecessary erasure of these data blocks in the early life of the storage device. Then, as the storage device ages, the constraint on static wear levelness tightens, thereby freeing up low erasure count data blocks containing static data as needed for dynamic data and their associated higher erasure frequency. A constraint that tightens as the storage device ages not only substantially avoids wear leveling of static data that later becomes dynamic, it also reduces the total number of times when static data is subject to wear leveling. This increases the total number of useful data block erasures that the storage device is capable of achieving, which accordingly extends the useful life of the storage device.

Figure 1:
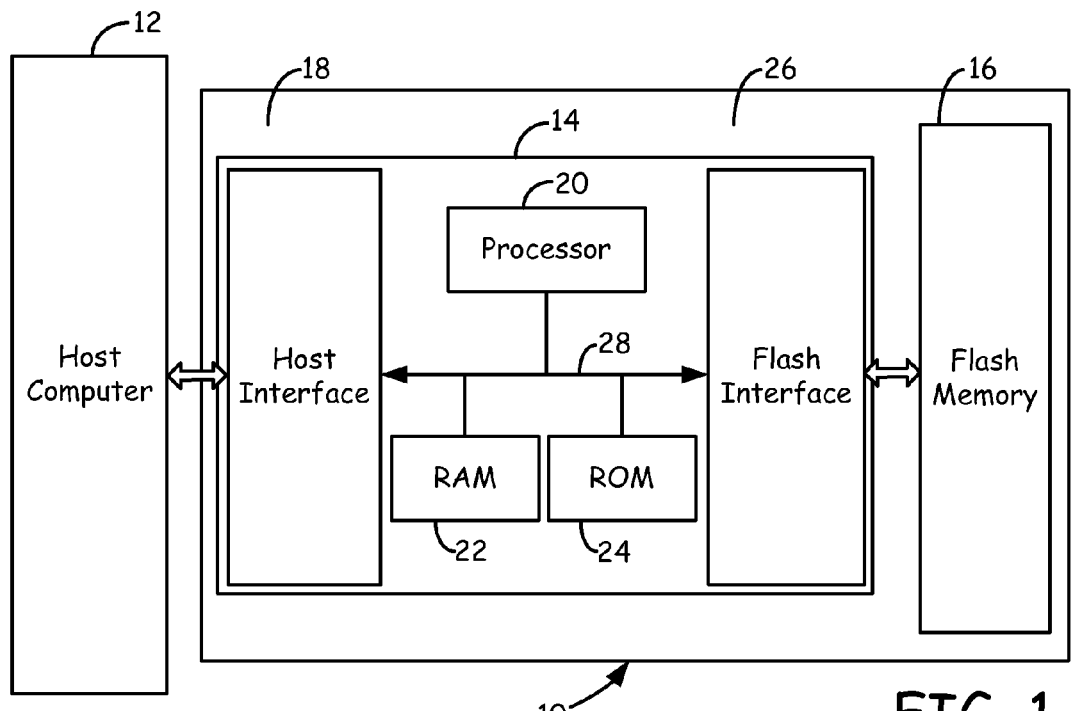
FIG. 1 is a schematic illustration of a storage device in use with a host computer, where the storage device is configured to perform a wear leveling technique of the present disclosure.

FIG. 1 is a schematic illustration of storage device 10 in use with host computer 12, where storage device 10 may be a variety of different storage devices (e.g., flash-based storage devices), and is configured to read and write data with the wear leveling technique of the present disclosure. As discussed below, the wear leveling technique desirably provides a loose constraint on the wear levelness of data blocks containing static data during the early life of storage device 10, but tightens the constraint as storage device 10 ages. This reduces the additional wear on storage device 10 that may otherwise be induced for the sake of maintaining uniform or near uniform wear levelness.

As shown in FIG. 1, storage device 10 includes controller 14 and flash memory 16, where controller 14 includes host interface 18, processor 20, random access memory (RAM) module 22, read-only memory (ROM) module 24, flash interface 26, and data bus 28, each of which may be conventional components of a flash-based storage device (e.g., flash drives and solid state drives). Accordingly, host interface 18, processor 20, RAM module 22, ROM module 24, and flash interface 26 may communicate with each other via data bus 28, and flash memory 16 may communicate with controller 14 via flash interface 26. Furthermore, controller 14 may communicate with host computer 12 via host interface 18, where host interface 18 may be any suitable interface, such as a universal serial bus (USB) interface, a Serial ATA interface, and the like.

During operation, host computer 12 may communicate with storage device 10 to read data from, and write data to flash memory 16. Firmware for performing read and write operations may be stored on any suitable storage medium in storage device 10 (e.g., ROM module 24 and flash memory 16) and/or in host computer 12, and may be executed by processor 20. Additionally, firmware for implementing the wear leveling technique of the present disclosure may also be stored any suitable storage medium in storage device 10 (e.g., ROM module 24 and flash memory 16) and/or in host computer 12, and may also be executed by processor 20. Storage device 10 and/or host computer 12 may also include a variety of additional firmware instructions for operating storage device 10 (e.g., error detection and correction commands).

Figure 2:
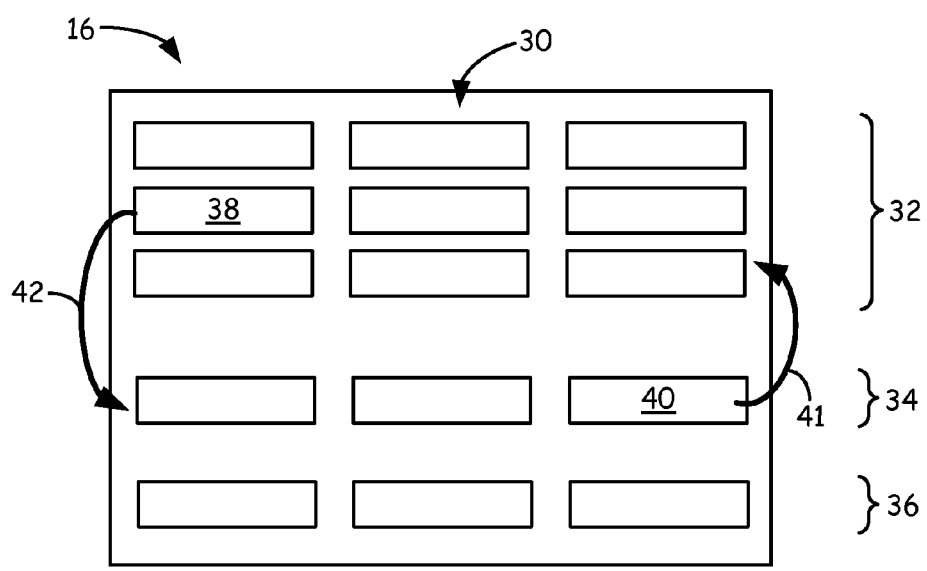
FIG. 2 is a schematic illustration of a flash memory of the storage device.

FIG. 2 is a simplified schematic illustration of flash memory 16 of storage device 10. In the shown embodiment, flash memory 16 is a non-volatile storage medium that includes a plurality of data blocks 30. Data blocks 30 are erasable data blocks of flash memory 16 for writing, rewriting, storing, and reading data. In the shown embodiment, data blocks 30 are divided into general data blocks 32, free data blocks 34, and metadata blocks 36. The illustration of general data blocks 32, free data blocks 34, and metadata blocks 36 being divided into separate regions of flash memory 16 is merely provided for ease of discussion. Instead, data blocks 30 may be dynamically allocated to a use, and when available for reuse, may be placed back into the free pool (e.g., by modifying the logical block address mapping).

General data blocks 32 encompass a first portion of data blocks 30 and are desirably the primary data blocks for writing data to and reading data from. Free data blocks 34 encompass a second portion of data blocks 30, which may be maintained as a pool of available data blocks for subsequent rewriting operations. Metadata blocks 36 encompass a third portion of data blocks 30 that desirably contain data relating to the data blocks 30, such as the erasure counts for each data block 30. Data may be written, rewritten, and erased to and from metadata blocks 36 in the same manner as for general data blocks 32 and free data blocks 34. Thus, the wear leveling technique applied to data blocks 30 may also apply to metadata blocks 36.

Prior to use with host computer 12 (shown in FIG. 1), general data blocks 32 and free data blocks 34 are desirably unwritten and erased, and metadata blocks 36 may retain the erasure count for each data block 30, where the initial erasure count for each data block 30 is typically zero. During an initial operation with host computer 12, the erasure counts from Metadata blocks 36 may be loaded into RAM module 22 (shown in FIG. 1) and/or a suitable location in host computer 12, thereby allowing the erasure counts to be monitored.

In the example shown in FIG. 2, static and dynamic data may be written to one or more general data blocks 32. The writing operation may be performed with processor 20, which may map the locations of data blocks 30 to logical addresses retained in RAM module 22. When a given set of dynamic data needs to be rewritten from a previously written data block 32, the dynamic data may be written to one or more of free data blocks 34, and the data block 32 containing the previous version of the data may then be erased. For example, when rewriting data retained in data block 38, the more recent version may be written to an available data block in free data blocks 34 (referred to as data block 40). The data block selected from free data blocks 34 as the destination for dynamic data is typically the one having the lowest or a relatively low erasure count among the group of free data blocks 34. Correspondingly, data block 38 may then be erased, which increases the erasure count of data block 38 by one erasure. Furthermore, the written data block 40 is then included in general data blocks 32 as depicted by arrow 41, and the erased data block 38 is included in free data blocks 34 as depicted by arrow 42. In operation, this may be performed with processor 20, where processor 20 may remap the logical addresses to the locations of data blocks 30.

This process of writing new data to general data blocks 32, rewriting data to a low erasure count free data block 34 and erasing the previous data from general data blocks 32, and the like may then be repeated to provide a first order of wear leveling that extends the useful life of storage device 10 based on the dynamic data. Accordingly, as dynamic data continues to be rewritten, the erasure counts for the respective data blocks 30 being circulated for dynamic data increase. In comparison, however, the data blocks containing the static data are not frequently rewritten and the erasure counts for the respective data blocks 30 do not increase. Thus, while the erasure counts continue to increase for the data blocks containing the dynamic data, the erasure counts for the data blocks containing the static data remain low, even possibly at zero. This increases the difference between the maximum erasure count and the minimum erasure count for data blocks 30.

Figure 3:
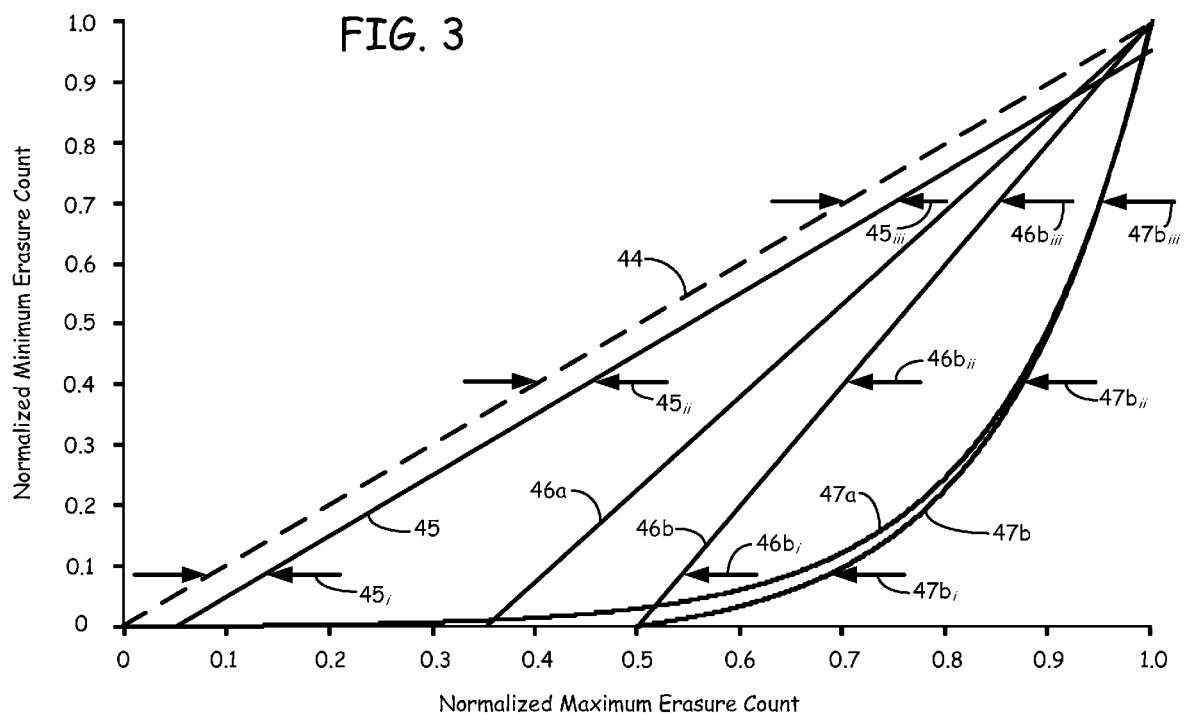
FIG. 3 is a graphical illustration of minimum erasure count versus maximum erasure count of a storage device, illustrating a comparison of the wear leveling technique of the present disclosure to a conventional wear leveling technique.

FIG. 3 is a graphical illustration of the minimum erasure count versus the maximum erasure count of a storage device (e.g., storage device 10), where the minimum erasure count and the maximum erasure count are normalized to the EOL erasure count of the storage device. Thus, the maximum erasure count of 1.0 is the end of life point of the storage device (i.e., the maximum erasure count is equal to the EOL erasure count). FIG. 3 includes base line 44 (shown with broken lines), threshold curve 45 attained under a conventional wear leveling technique, and threshold curves 46a, 46b, 47a, and 47b attained under the wear leveling technique of the present disclosure.

The minimum erasure counts of a given storage device cannot be greater than the maximum erasure counts of the storage device. Thus, the operating point of the minimum and maximum erasures counts must fall within a region that is below and to the right of base line 44, where base line 44 has a slope in which the minimum erasure count is equal to the maximum erasure count (i.e., a slope of 1.0). Base line 44 accordingly defines a situation in which no constraint on static wear levelness is present, where static data is moved and erased whenever necessary to minimize the difference between the maximum and minimum erasure counts (i.e., a uniform wear levelness).

Threshold curve 45 is based on a conventional wear leveling technique that uses a constraint on static wear levelness that is constant over the life of the storage device. In operation, as the maximum erasure count increases, the operating point moves to the right from base line 44 until it reaches threshold curve 45. At that point, static data is moved and the corresponding data blocks are erased and made available for subsequent writing operations. This may increase the minimum erasure count, which moves the operating point upward and away from threshold curve 45. This process may then be repeated over the life of the storage device, thereby maintaining the operating point between base line 44 and threshold curve 45.

As shown in FIG. 3, the constant constraint on static wear levelness results in threshold curve 45 having the same slope as base line 44. Thus, the difference between the maximum and minimum erasure counts to be attained before the wear leveling of static data is performed is held constant over the life of the storage device. See, for example, differences $45_i$, $45_{ii}$, and $45_{iii}$ in FIG. 3, which are the differences between threshold line 45 and base line 44, and are the same at subsequent points along the maximum erasure count. While the offset from base line 44 provides a moderate buffer against continuous movement and erasures of static data, the constant constraint can result in a large number of erasures during the early life of the storage device. As discussed above, this reduces the total number of useful data block erasures, which reduces the useful life of the storage device. Furthermore, at the end of life of the storage device, the constant constraint prevents the minimum erasure counts from reaching the maximum erasure counts, as illustrated by the lower terminus point of threshold curve 45. This precludes data blocks from being freed up at the end of life of the storage device.

In comparison, the wear leveling technique of the present disclosure may be based on a constraint on static wear levelness that is not constant, but varies over the life of the storage device. In one embodiment, this variation in the constraint may have a linear or substantially linear trend over the life of the storage device. This provides a linear threshold curve having a slope that is greater than the slopes of base line 44 and threshold curve 45 (e.g., threshold curves 46a and 46b). As shown, in this embodiment, the constraint on the static wear levelness of the data blocks is looser during the early life of the storage device, thereby allowing a large difference between the maximum and minimum erasure counts to be attained before the wear leveling of static data is performed. For example, threshold curves 46a and 46b respectively allow the maximum erasure count to reach about 35% and 50% of the EOL erasure count of the storage device before performing the wear leveling on the static data.

As the storage device ages, however, the constraint tightens, which reduces the difference between the maximum and minimum erasure counts that may be attained before the wear leveling of static data is performed. See, for example, differences $46b_i$, $46b_{ii}$, and $46b_{iii}$ in FIG. 3, which are the differences between threshold line 46b and base line 44, and decrease at subsequent points along the maximum erasure count. Moreover, in contrast to threshold curve 45, the slopes of the linear threshold curves under this embodiment (e.g., threshold curves 46a and 46b) desirably allow the minimum erasure count of the data blocks to substantially reach the maximum erasure count of the data blocks at the end of life of the storage device.

In a second embodiment, the variation in the constraint on static wear levelness may have an exponential growth trend over the life of the storage device. This provides a threshold curve having an initial tangential slope that is less than the slope of base line 44 and threshold curve 45 (e.g., threshold curves 47a and 47b). However, the tangential slope of the threshold curve increases as the storage device ages until and eventually the tangential slope is greater than the slope of base line 44 and threshold curve 45. This embodiment also provides a loose constraint on the wear levelness of the static data during the early life of the storage device, and tightens this constraint as the storage device ages. See, for example, differences $47b_i$, $47b_{ii}$, and $47b_{iii}$ in FIG. 3, which are the differences between threshold line 47b and base line 44, and also decrease at subsequent points along the maximum erasure count. Additionally, as the storage device ages, the tangential slope of the threshold curve desirably increases in until the tangential slope allows the minimum erasure count of the data blocks to substantially reach the maximum erasure count of the data blocks at the end of life of the storage device.

A comparison of threshold curves 47a and 47b illustrate the variety of exponential growth trends that may be attained under the wear leveling technique of the present disclosure. For example, threshold curve 47a may result in minor amounts of wear leveling of static data in the early life of the storage device. To avoid this, the exponential growth trend may be offset to a given starting point along the life of the storage device, as shown by threshold trend 47b, which is offset to about 50% of the maximum erasure counts.

Threshold curves 46a, 46b, 47a, and 47b are examples of suitable linear and exponential growth trends that may be attained with a constraint on static wear levelness that varies over the life of the storage device. In alternative embodiments, the wear leveling technique of the present disclosure may be based on a variety of functions that vary the constraint on static wear levelness over the life of the storage device. The varying constraints preclude the unnecessary movement and erasure of the static data in the early life of the storage device, which, as discussed above, extends the usable life of the storage device. Furthermore, the tightening the constraints over the lives of the storage devices allow data blocks containing static data to be freed up as needed in time to be useful for dynamic data.

Figure 4:
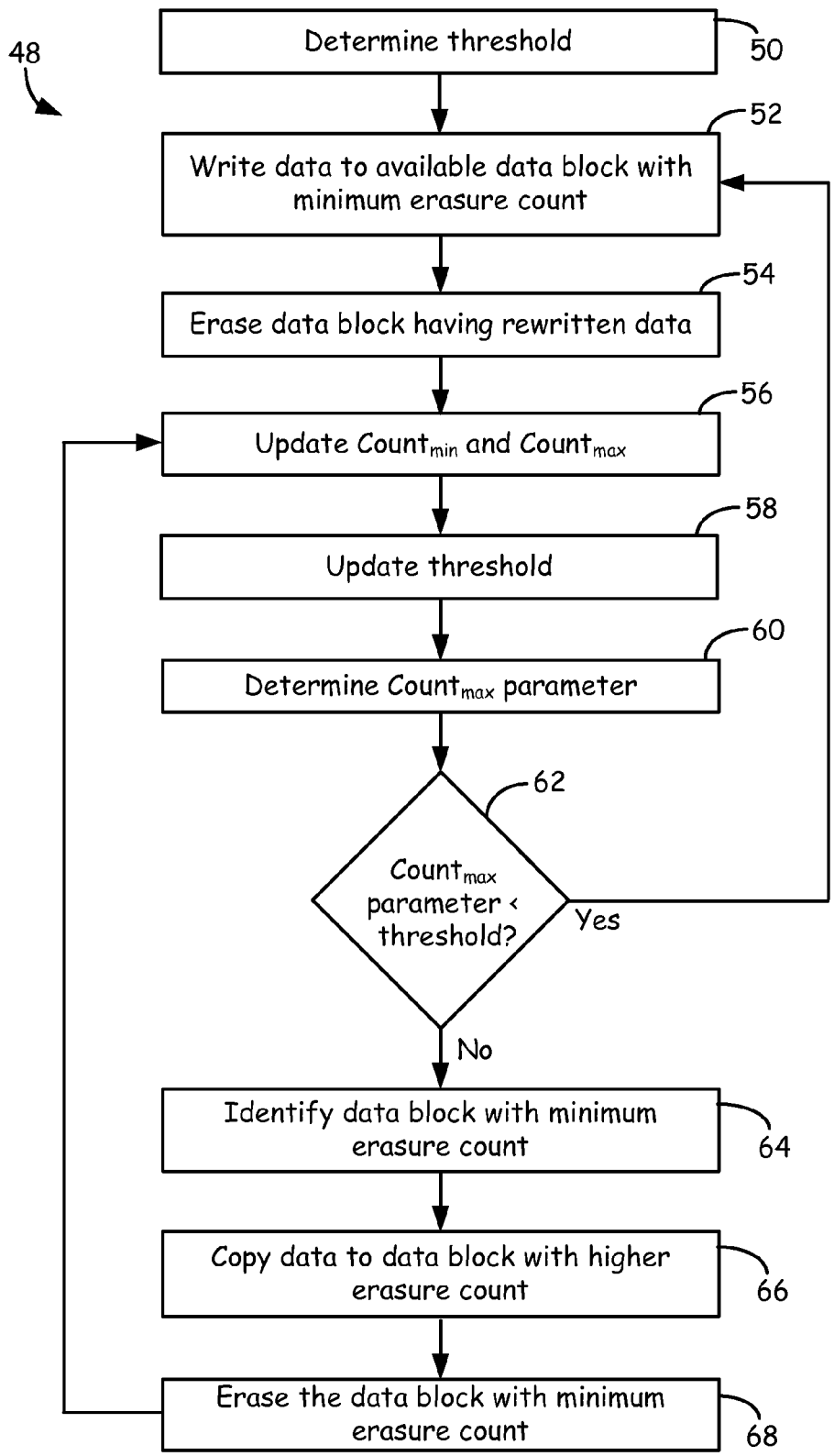
FIG. 4 is a flow diagram of a method for performing the wear leveling technique of the present disclosure.

FIG. 4 is a flow diagram of method 48 for managing wear levels in a flash-based storage device (e.g., storage device 10). The following discussion of method 48 is made with reference to storage device 10 with the understanding that method 48 is suitable for use with a variety of storage devices (e.g., flash-based storage devices). As shown, method 48 includes steps 50-68, and initially involves determining a constraint threshold for flash memory 16 (step 50). As discussed above, the constraint on static wear levelness varies over the life of storage device 10, and may provide substantially linear and/or substantially non-linear trends (e.g., exponential growth trends) that are desirably not collinear with or parallel to base line 44.

The constraint threshold may be based at least in part on the erasure counts of data blocks 30, such as the minimum erasure count. For example, in embodiments involving a linear trend, the constraint threshold may be a sloped function of the minimum erasure count of data blocks 30, which may also be offset by an initial maximum erasure count of data blocks 30 before the wear leveling of static data is performed. In this embodiment, the maximum erasure count and the minimum erasure count may be determined (e.g., with processor 20 or host computer 12) from the current erasure counts of data blocks 30, and the maximum erasure count and the minimum erasure count may also be stored in RAM module 22 (shown in FIG. 1).

The constraint threshold may also be based in part on an EOL erasure count for all of data blocks 30, thereby normalizing the constraint threshold to the EOL erasure count as illustrated in FIG. 3. For example, the linear-trend constraint threshold of storage device 10 may be determined by the following formula:

$$\text{Constraint Threshold} = \frac{(\text{Slope})(Count_{min}) + Count_{max,Initial}}{\text{EOL Count}} \quad \text{(Equation 1)}$$

where "Slope" is the desired slope of the threshold curve, "EOL Count" is the EOL erasure count of data blocks 30, "$Count_{max,Initial}$" is the initial maximum erasure count of data blocks 30 before the wear leveling of static data is performed (i.e., where the threshold curve intersects the base axis in FIG. 3, such as about 35% for threshold curve 46a), and "$Count_{min}$" is the minimum erasure count of data blocks 30. Furthermore, the Slope under Equation 1 is desirably greater than 1.0 and desirably allows minimum erasure count to substantially reach the maximum erasure count at the end of life point of storage device 10 (i.e., when the maximum erasure count reaches the EOL erasure count). Thus, the Slope is also dependent on the initial maximum erasure count of data blocks 30 before the wear leveling of static data is performed (i.e., $Count_{max,Initial}$).

Alternatively, in embodiments involving an exponential growth trend, the constraint threshold may be an exponential growth function of the minimum erasure count of data blocks 30. The constraint threshold may also be based in part on the EOL erasure count for all of data blocks 30, thereby normalizing the constraint threshold to the EOL erasure count as illustrated in FIG. 3. For example, the exponential-trend constraint threshold of storage device 10 may be determined by the following formula:

$$\text{Constraint Threshold} = n^{\left[\frac{Count_{min}}{EOL\ Count} - 1\right]} \quad \text{(Equation 2)}$$

where suitable values for "n" range from about 10 to 10,000, with particularly, suitable values ranging from about 500 to about 5,000, and with even more particularly suitable values ranging from about 900 to about 1,200. Furthermore, Equation 2 may be offset by an initial maximum erasure count of data blocks 30 before the wear leveling of static data is performed, such as determined by the following formula:

$$\text{Constraint Threshold} = n^{\left[\frac{Count_{min}}{EOL\ Count} - 1\right]} + \frac{Count_{max,Initial}}{EOL\ Count} \quad \text{(Equation 3)}$$

In addition to being measured as a function of the erasure counts of data blocks 30, the constraint threshold may also be a function of a variety of quantifiable properties of data blocks 30. In some embodiments, the constraint threshold may also take into account the conditions of storage device 10 during reading, writing, and erasing operations. For example, data written to data blocks 30 under elevated or lowered temperatures may need to be moved sooner to reduce the risk of data loss. Similarly, higher voltage conditions during erasure operations may potentially induce strain to the oxide layers of data blocks 30, thereby inducing additional wear into the given data blocks 30.

Furthermore, the error rates of data blocks 30 may be monitored to identify deviations from estimated wear levels. If a given data block 30 exhibits higher than expected error rates, the expected remaining life of the data block 30 may be reduced accordingly. The times required to read, write, and erase data blocks 30 may also be monitored to identify deviations from estimated times. Such deviations may also be attributed to reductions in the expected remaining lives of one or more of data blocks 30. Any of these quantifiable properties of data blocks 30, alone or in combination, may also be used to adjust the resulting value of the constraint threshold, and/or may be used to adjust the normalization of the erasure count for the respective data block.

After the constraint threshold is initially determined, data may be written to an available data block having the minimum erasure count among data blocks 30 (step 52). For example, in the early life of storage device 10, the minimum erasure count may be attained from a general data block 32 having an erasure count of zero. Alternatively, the available data block may be a reserved data block 34 in the reserved pool of data blocks (e.g., reserved data block 40). Once the data has been properly written to the available data block, the data block containing the previous version of the data (e.g., data block 38) may be erased (step 54).

After data block 38 is erased, processor 20 may update one or more of the erasure counts of data block 30, including the additional erasure of data block 38, and retain the updated erasure count(s) in RAM module 22. The updating of the erasure count(s) may also update one or both of the maximum erasure count and the minimum erasure count, and these values may also be stored in RAM module 22 (shown in FIG. 1) (step 56).

The constraint threshold may then be updated (step 58). For example, the constraint threshold may be updated pursuant to Equations 1-3, and relying on any updates to the minimum erasure count attained during step 56. As discussed above, the constraint threshold may also be a function of a variety of quantifiable properties of data blocks 30 (e.g., reading, writing, and erasing conditions, error rates, and times required to perform read, write, and erasure operations). In such embodiments, the quantifiable properties of data blocks 30 may be monitored and updated continuously or intermittently (e.g., during updating step 56). Accordingly, pursuant to step 58 of method 48, the constraint threshold may also be updated relying on any updates to the quantifiable properties of data blocks 30.

Processor 20 may then determine a parameter relating to the maximum erasure count of data blocks 30 (referred to as the $Count_{max}$ parameter) (step 60). In one embodiment, the $Count_{max}$ parameter may be the maximum erasure count of data blocks 30. Alternatively, the $Count_{max}$ parameter may be determined by the following formula:

$$Count_{max} \text{ parameter} = \frac{Count_{max} - Count_{min}}{EOL\ Count} \quad \text{(Equation 4)}$$

In the embodiment represented by Equation 4, the maximum erasure count of data blocks 30 is normalized to the predicted or predetermined capability of flash memory 16.

The $Count_{max}$ parameter may then be compared to the constraint threshold to determine whether the $Count_{max}$ parameter meets and/or exceeds the constraint threshold (step 62). This comparison under step 60 prevents the maximum erasure count of data blocks 30 from being bounded until the constraint threshold is met and/or exceeded. In effect, this limits the writing and erasing operations to data blocks that maintain the $Count_{max}$ parameter bounded by the constraint threshold, as illustrated by threshold curves 46a and 46b in FIG. 3.

The algorithms represented under Equations 1-4 are examples of suitable functions that may be used to represent linear trends for threshold curves under the wear leveling technique of the present disclosure. It is understood that the Equations 1-4 may be modified in a variety of manners while still attaining the same or similar threshold curves. For example, the $Count_{max}$ parameter in Equation 4 may be represented as a function of the difference between the current maximum erasure count and the current minimum erasure count, and Equations 1-3 may be modified accordingly. Additionally, the constraint threshold and the $Count_{max}$ parameter may alternatively be based on the reciprocating minimum and maximum erasure counts, where the constraint threshold is based at least in part on the maximum erasure count and the $Count_{max}$ parameter is based at least in part on the minimum erasure count. Furthermore, Equations 1-4 may also be based on actual values of the maximum erasure counts and the minimum erasure counts, rather than being normalized to the EOL erasure count.

Steps 52-62 of method 48 may then be repeated until the point at which the $Count_{max}$ parameter meets or exceeds the constraint threshold. When this occurs, static data may be moved to a data block having a higher erasure count, pursuant to steps 64, 66, and 68. The movement of static data may initially involve identifying the data block 30 having a low erasure count (e.g., the minimum erasure count) (step 64). As discussed above, static data is data that is not frequently rewritten or deleted. Thus, the data block 30 having the minimum erasure count typically contains static data. The static data may then be copied to an available data block having a higher erasure count (step 66). For example, the static data may be written to a reserved data block 34 having an erasure count that is higher than the minimum erasure count. In one embodiment, step 66 involves writing the static data to an available data block (e.g., a reserved data block 34) having the highest erasure count of the available data blocks. Alternatively, the destination data block may also be selected based on other criteria, such as a data block having sufficient data retention metrics. The data block containing the previously copied static data (and having the minimum erasure count) may then be erased and allocated for subsequent writing operations (step 68).

The minimum and maximum erasure counts, the constraint threshold, and the $Count_{max}$ parameter may then be updated, pursuant to steps 56, 58, and 60, and the $Count_{max}$ parameter may be compared to the constraint threshold again to determine if any additional static data should be moved (step 62). The steps of method 48 may then continue as additional data is written or rewritten to data blocks 30. Accordingly, as additional data is written or rewritten, the constraint on static wear levelness tightens pursuant to the linear and/or exponential growth trend. Thus, in the early life of storage device 10, a large difference between maximum and minimum erasure counts may be attained before the wear leveling of static data is performed. However, as the storage device ages, the constraint tightens, thereby reducing the difference between maximum and minimum erasure counts that may be attained before additional wear leveling of static data is performed. In one embodiment, the static data is not moved until the number of maximum erasure count is at least about 25% of the EOL erasure count of storage device 10, more desirably at least about 35%, and even more desirably at least about 50%. As discussed above, the varying constraint reduces the additional number of erasures on data blocks 30 that may otherwise be induced for the sake of maintaining uniform wear levelness, thereby extending the useful life of storage device 10.

While the above-discussed wear leveling technique of the present disclosure is described as being based on erasure counts of the data blocks (e.g., data blocks 30), the constraint on static wear levelness may alternatively (or additionally) be based on other criteria that define the age of the storage device (e.g., storage device 10). For example, the constraint may be based on error rates of the data blocks, where data blocks having low error rates have a lot of useful program-erase cycles remaining and data blocks having high error rates have less useful program-erase cycles remaining. Thus, in this embodiment, data (e.g., static data) may be moved from data blocks having low error rates to data blocks having high error rates, thereby freeing up the data blocks having low error rates for subsequent writing operations.

In additional alternative embodiments, the wear leveling technique may be performed over only a portion of the life of a storage device (e.g., storage device 10). For example, the constraint on static wear levelness may be withheld until a certain number of maximum erasure counts is reached.

Although the present disclosure has been described with reference to preferred embodiments, workers skilled in the art will recognize that changes may be made in form and detail without departing from the spirit and scope of the disclosure.

The invention claimed is:

1. A method for managing wear levels in a storage device having a plurality of data blocks, the method comprising:
   (a) copying data from a data block having a first erasure count to a data block having a higher erasure count than the first erasure count;
   (b) erasing the data from the data block having the first erasure count after copying the data;
   (c) allocating the erased data block for a subsequent writing operation; and
   (d) repeating steps (a)-(c) based on a constraint on static wear levelness that tightens over the lives of the plurality of data blocks, wherein the constraint on static wear levelness restricts the copying of the data until a maximum erasure count of the plurality of data blocks is at least about 25% of an end-of-life erasure count of the plurality of data blocks.

2. The method of claim 1, wherein the lives of the plurality of data blocks are based at least in part on a factor selected from the group consisting of erasure counts of the plurality of data blocks, error rates of the plurality of data blocks, and a combination thereof.

3. The method of claim 1, and further comprising:
   determining a parameter based at least in part on a maximum erasure count of the plurality of data blocks; and
   determining a constraint threshold based at least in part on a minimum erasure count of the plurality of data blocks, wherein the data is copied in a manner that maintains the parameter bounded by the constraint threshold.

4. The method of claim 3, wherein the constraint threshold is defined by a substantially linear function of the minimum erasure count and the maximum erasure count.

5. The method of claim 3, wherein the constraint threshold is defined by a substantially exponential function of the minimum erasure count and the maximum erasure count.

6. The method of claim 3, and further comprising:
   updating the minimum erasure count;
   updating the maximum erasure count;
   updating the parameter based at least in part on the updated maximum erasure count; and
   updating the wear levelness threshold based at least in part on the updated minimum erasure count.

7. The method of claim 1, wherein the constraint on static wear levelness restricts the copying of the data until the maximum erasure count is at least about 35% of the end-of-life erasure count.

8. The method of claim 7, wherein the constraint on static wear levelness restricts the copying of the data until the maximum erasure count is at least about 50% of the end-of-life erasure count.

9. A method for managing wear levels in a storage device having a plurality of data blocks, the method comprising:
   determining an erasure count for each of the plurality of data blocks;
   determining a parameter based at least in part on a maximum erasure count of the determined erasure counts;
   determining a constraint threshold that defines a constraint on static wear levelness that varies over the lives of the plurality of data blocks, wherein the constraint threshold is defined by at least one function selected from the group consisting of a substantially linear function of a minimum erasure count of the determined erasure counts and the maximum erasure count, a substantially exponential function of the minimum erasure count and the maximum erasure count, and combinations thereof; and
   moving data from a first data block having a first erasure count to a second data block having an erasure count higher than the first erasure count in a manner that maintains the parameter bounded by the constraint threshold.

10. The method of claim 9, wherein moving the data from the first data block to the second data block comprises:
    copying the data from the first data block to the second data block;
    erasing the data from the first data block; and
    allocating the first erased data block for a subsequent writing operation.

11. The method of claim 9, wherein the constraint on static wear levelness restricts the copying of the data until a maximum erasure count of the plurality of data blocks is at least about 25% of an end-of-life erasure count of the plurality of data blocks.

12. The method of claim 9, wherein the constraint threshold is determined based at least in part on a minimum erasure count of the determined erasure counts.

13. The method of claim 12, wherein the constraint threshold is further determined based on an end-of-life erasure count of the plurality of data blocks.

14. The method of claim 12, wherein the constraint threshold is further determined based on at least one quantifiable property of the plurality of the data blocks.

15. A method for managing wear levels in a storage device having a plurality of data blocks, the method comprising:
    determining a parameter based at least in part on a maximum erasure count of the plurality of data blocks;
    determining a constraint threshold based at least in part on a minimum erasure count of the plurality of data blocks; and
    copying data from a first data block to a second data block having a higher erasure count in a manner that maintains the parameter bounded by the constraint threshold, wherein the manner that constrains the parameter to the constraint threshold prevents the data from being moved from the first data block to the second data block until the maximum erasure count is at least about 25% of an end-of-life erasure count of the plurality of data blocks.

16. The method of claim 15, and further comprising:
    erasing the first data block after copying the data;
    updating the minimum erasure count and the maximum erasure count based at least in part on the erased first data block;
    updating the parameter based at least in part on the updated maximum erasure count; and
    updating the constraint threshold based at least in part on the updated minimum erasure count.

17. The method of claim 15, wherein the constraint threshold varies over at least a portion of the lives of the plurality of data blocks.

18. The method of claim 15, wherein the constraint threshold and the parameter are each further determined based on an end-of-life erasure count of the plurality of data blocks.

19. The method of claim 15, wherein the data is prevented from being moved from the first data block to the second data block until the maximum erasure count is at least about 35% of the end-of-life erasure count.

20. The method of claim 19, wherein the data is prevented from being moved from the first data block to the second data block until the maximum erasure count is at least about 50% of the end-of-life erasure count.

* * * * *